(12) United States Patent
Ren

(10) Patent No.: US 10,488,719 B2
(45) Date of Patent: Nov. 26, 2019

(54) IPS ARRAY SUBSTRATE AND LIQUID CRYSTAL DISPLAY PANEL

(71) Applicant: SHENZHEN CHINA STAR OPTOELECTRONICS TECHNOLOGY CO., LTD., Shenzhen, Guangdong (CN)

(72) Inventor: Wei Ren, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/576,141

(22) PCT Filed: Apr. 25, 2017

(86) PCT No.: PCT/CN2017/081833
§ 371 (c)(1),
(2) Date: Nov. 21, 2017

(87) PCT Pub. No.: WO2018/176540
PCT Pub. Date: Oct. 4, 2018

(65) Prior Publication Data
US 2018/0364529 A1 Dec. 20, 2018

(30) Foreign Application Priority Data
Apr. 1, 2017 (CN) .......................... 2017 1 0212929

(51) Int. Cl.
*H01L 27/12* (2006.01)
*G02F 1/1343* (2006.01)
(Continued)

(52) U.S. Cl.
CPC .... *G02F 1/134363* (2013.01); *G02F 1/13439* (2013.01); *H01L 27/124* (2013.01);
(Continued)

(58) Field of Classification Search
CPC ..... G02F 2001/13629; G02F 1/133707; G02F 1/134363; G02F 1/13439; G02F 2201/121;
(Continued)

(56) References Cited

U.S. PATENT DOCUMENTS 5,667,853 A * 9/1997 Fukuyoshi ............ C23C 14/086
349/139
7,256,851 B2 * 8/2007 Park .................. G02F 1/134363
349/138
(Continued)

FOREIGN PATENT DOCUMENTS

| CN | 1667477 A | 9/2005 |
| CN | 101989015 A | 3/2011 |
| CN | 104536213 A | 4/2015 |

*Primary Examiner* — Eric A. Ward
(74) *Attorney, Agent, or Firm* — Hauptman Ham, LLP

(57) ABSTRACT

An IPS array substrate and a liquid crystal display panel are provided. The IPS array substrate includes a substrate, a common line, a data line, a plurality of pixel electrodes, and a plurality of common electrodes. Each of the pixel electrodes and the common electrodes includes a first transparent electrode layer, a second transparent electrode layer, and a metal layer between the first transparent electrode layer and the second transparent electrode layer.

18 Claims, 1 Drawing Sheet

(51) Int. Cl.
 *G02F 1/1362* (2006.01)
 *G02F 1/1337* (2006.01)
(52) U.S. Cl.
 CPC ...... H01L 27/1244 (2013.01); H01L 27/1248 (2013.01); *G02F 1/133707* (2013.01); *G02F 2201/121* (2013.01); *G02F 2201/123* (2013.01)
(58) Field of Classification Search
 CPC ............. G02F 2201/123; H01L 27/124; H01L 27/1244; H01L 27/1248
 See application file for complete search history.

(56) References Cited

U.S. PATENT DOCUMENTS

| | | | |
|---|---|---|---|
| 7,776,635 B2* | 8/2010 | Ahn | G02F 1/134363 |
| | | | 349/110 |
| 8,647,902 B2* | 2/2014 | Lee | G02F 1/134363 |
| | | | 257/59 |
| 8,786,811 B2* | 7/2014 | Kubota | G02F 1/133707 |
| | | | 349/141 |
| 8,848,156 B2* | 9/2014 | Lee | G02F 1/134309 |
| | | | 349/138 |
| 2005/0200791 A1 | 9/2005 | Ahn | |
| 2014/0170413 A1* | 6/2014 | Hassan | C23C 28/42 |
| | | | 428/336 |
| 2016/0181286 A1 | 6/2016 | Hao | |
| 2018/0217454 A1* | 8/2018 | Zhou | G02F 1/1343 |

* cited by examiner

IPS ARRAY SUBSTRATE AND LIQUID CRYSTAL DISPLAY PANEL

CROSS REFERENCE TO RELATED APPLICATION

This present application is a national stage filing under 35 U.S.C § 371 of PCT application number PCT/CN2017/081833 filed on Apr. 25, 2017 which is based upon and claims the benefit of priority to Chinese Patent Application No. 201710212929.4 filed on Apr. 1, 2017 in the State Intellectual Property Office of the P.R.C. The disclosures of the above-listed applications are hereby incorporated by reference herein in their entirety.

FIELD OF THE INVENTION

The present disclosure relates to the technical field of displays, and particularly to an IPS array substrate and a liquid crystal display panel.

BACKGROUND OF THE DISCLOSURE

Active thin film transistor liquid crystal displays (TFT-LCD) have been developing rapidly in recent years. In-plane switching displays (IPS) in TFT-LCDs are widely used in televisions and general display apparatuses having a touch function.

Two types of electrodes, the pixel electrodes and the common electrodes, in IPS displays controlling the liquid crystal molecules are manufactured on the same substrate, unlike the conventional twisted nematic (TN) liquid crystal displays, where the two types of electrodes are respectively disposed on an upper substrate and a lower substrate, and the liquid crystals are arranged perpendicularly to the substrates under the effect of the electric field. In IPS displays, an indium tin oxide (ITO) is a material usually used for the common electrodes and the pixel electrodes, and an ITO is disposed on the entire surface of the common electrodes, resulting in excessive impedance.

SUMMARY OF THE INVENTION

An object of the present disclosure is to provide an IPS type array substrate and a liquid crystal display panel, which can reduce impedance.

An IPS array substrate is provided in an embodiment of the present disclosure, including: a substrate, a common line, a data line, a plurality of pixel electrodes, and a plurality of common electrodes;

wherein the common line is disposed on the substrate;
the data line is disposed on the substrate;
the pixel electrodes are disposed on the substrate and electrically connected with the data line;
the common electrodes and the pixel electrodes are alternately arranged on the substrate, the common electrodes are electrically connected with the common line, and the common electrodes and the pixel electrodes are configured to generate a horizontally oriented electric field; and
each of the pixel electrodes and the common electrodes includes a first transparent electrode layer, a second transparent electrode layer, and a metal layer between the first transparent electrode layer and the second transparent electrode layer.

In the IPS array substrate of the present disclosure, the array substrate further includes a plurality of passivation layers, the passivation layers are disposed between the substrate and the pixel electrodes, and grooves are formed between the adjacent passivation layers, and the common electrodes are disposed within the grooves.

In the IPS array substrate of the present disclosure, each of the first transparent electrode layers and the second transparent electrode layers includes an indium tin oxide.

In the IPS array substrate of the present disclosure, a thickness of each of the first transparent electrode layers is ranged from 10 to 12 nanometers.

In the IPS array substrate of the present disclosure, a thickness of each of the second transparent electrode layers is ranged from 10 to 12 nanometers.

In the IPS array substrate of the present disclosure, a material of each of the metal layers is a copper or an aluminum.

In the IPS array substrate of the present disclosure, a thickness of each of the metal layers is ranged from 1 to 4 nanometers.

In the IPS array substrate of the present disclosure, the pixel electrodes and the common electrodes undergo an oxalic acid etching at a temperature from 45 to 60° C. for 110 to 130 seconds to respectively form a pixel electrode pattern and a common electrode pattern.

In the IPS array substrate of the present disclosure, the pixel electrodes and the common electrodes are formed in a same masking process.

An IPS array substrate is further provided in an embodiment of the present disclosure, including a substrate, a common line, a data line, a plurality of pixel electrodes, and a plurality of common electrodes;

wherein the common line is disposed on the substrate;
the data line is disposed on the substrate;
the pixel electrodes are disposed on the substrate and electrically connected with the data line;
the common electrodes and the pixel electrodes are alternately arranged on the substrate, the common electrodes are electrically connected with the common line, and the common electrodes and the pixel electrodes are configured to generate a horizontally oriented electric field; and
each of the pixel electrodes and the common electrodes includes a first transparent electrode layer, a second transparent electrode layer, and a metal layer between the first transparent electrode layer and the second transparent electrode layer.

In the IPS array substrate of the present disclosure, the array substrate further includes a plurality of passivation layers, the passivation layers are disposed between the substrate and the pixel electrodes, and grooves are formed between the adjacent passivation layers, and the common electrodes are disposed within the grooves.

In the IPS array substrate of the present disclosure, each of the first transparent electrode layers and the second transparent electrode layers includes an indium tin oxide.

In the IPS array substrate of the present disclosure, a thickness of each of the first transparent electrode layers is ranged from 10 to 12 nanometers.

In the IPS array substrate of the present disclosure, a thickness of each of the second transparent electrode layers is ranged from 10 to 12 nanometers.

In the IPS array substrate of the present disclosure, a material of each of the metal layers is a copper or an aluminum.

In the IPS array substrate of the present disclosure, a thickness of each of the metal layers is ranged from 1 to 4 nanometers.

In the IPS array substrate of the present disclosure, the pixel electrodes and the common electrodes undergo an oxalic acid etching at a temperature from 45 to 60° C. for 110 to 130 seconds to respectively form a pixel electrode pattern and a common electrode pattern.

In the IPS array substrate of the present disclosure, the pixel electrodes and the common electrodes are formed in a same masking process.

A liquid crystal display panel is provided in the present disclosure, including an IPS array substrate, which includes a substrate, a common line, a data line, a plurality of pixel electrodes, and a plurality of common electrodes;

wherein the common line is disposed on the substrate;

the data line is disposed on the substrate;

the pixel electrodes are disposed on the substrate and electrically connected with the data line;

the common electrodes and the pixel electrodes are alternately arranged on the substrate, the common electrodes are electrically connected with the common line, and the common electrodes and the pixel electrodes are configured to generate a horizontally oriented electric field; and each of the common electrodes and the pixel electrodes includes a first transparent electrode layer, a second transparent electrode layer, and a metal layer between the first transparent electrode layer and the second transparent electrode layer.

In the liquid crystal display panel of the present disclosure, the array substrate further includes a plurality of passivation layers, the passivation layers are disposed between the substrate and the pixel electrodes, and grooves are formed between the adjacent passivation layers, and the common electrodes are disposed within the grooves.

In the liquid crystal display panel of the present disclosure, each of the first transparent electrode layers and the second transparent electrode layers includes an indium tin oxide.

In the liquid crystal display panel of the present disclosure, a thickness of each of the first transparent electrode layers is ranged from 10 to 12 nanometers.

In the IPS array substrate and the liquid crystal display panel of the present disclosure, the impedance is reduced by a structure in which the pixel electrodes and the common electrodes are configured to have two transparent electrode layers sandwiching a metal layer, in comparison with the conventional IPS array substrate and the conventional liquid crystal display panel.

To make the present disclosure clearly understood, the preferred embodiments are given hereinafter and are described in detail with reference to the accompanying drawings.

DETAILED DESCRIPTION OF THE PREFERRED EMBODIMENTS

The following description of the embodiments with reference to the accompanying drawings is used to illustrate particular embodiments of the present disclosure. The directional terms referred to in the present disclosure, such as "upper", "lower", "front", "back", "left", "right", "inner", "outer", "side surface", etc. are only directions with regard to the accompanying drawings. Therefore, the directional terms used for describing and illustrating the present disclosure are not intended to limit the present disclosure.

In the figures, units with similar structures are denoted by the same reference numbers.

Figure 1:
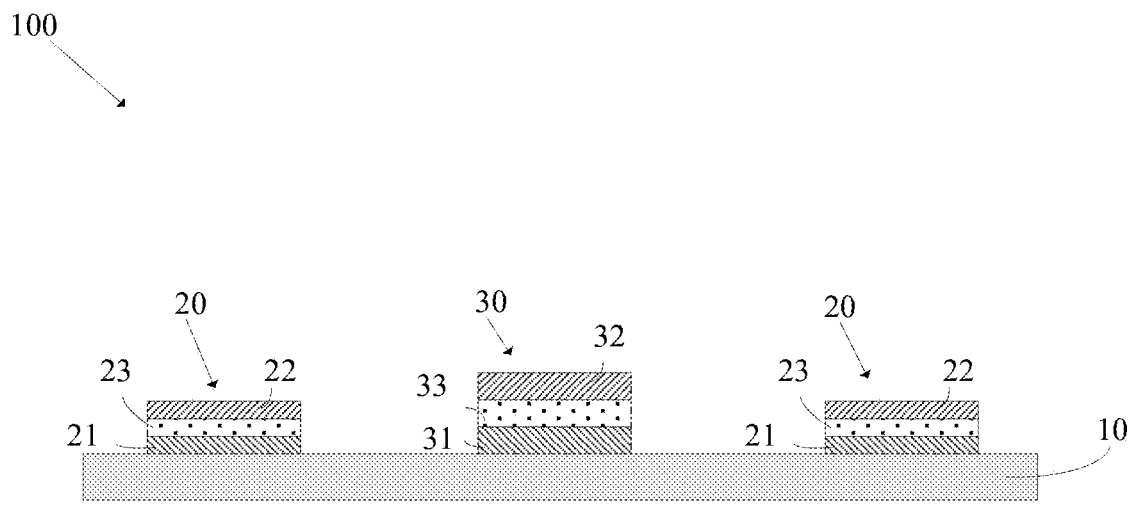
FIG. 1 is a schematic diagram of an IPS array substrate provided in an embodiment of the present disclosure.

Refer to FIG. 1, which is a schematic structural view of an IPS array substrate in accordance with a first preferred embodiment of the present disclosure. The IPS array substrate 100 in the present preferred embodiment includes a substrate 10, a common line (not shown), a data line (not shown), a plurality of pixel electrodes 20, and a plurality of common electrodes 30.

The common line and the data line are disposed on the substrate 10, wherein the common line is configured to transmit a common signal, and the data line is configured to transmit a data signal.

The pixel electrodes are disposed on the substrate 10 and electrically connected with the data line for receiving a data signal transmitted by the data line.

The common electrodes 30 are electrically connected with the common line for receiving a common signal transmitted by the common line. The common electrodes 30 and the pixel electrodes 20 are alternately arranged on the substrate 10, so that the common electrodes 30 and the pixel electrodes 20 generate a horizontally oriented electric field.

The pixel electrodes 20 are strip-shaped electrodes, each including a first transparent electrode layer 21, a second transparent electrode layer 22, and a metal layer 22 between the first transparent electrode layer 20 and the second transparent electrode layer 21.

The common electrodes 30 are strip-shaped electrodes, each including a first transparent electrode layer 31, a second transparent electrode layer 32, and a metal layer 33 between the first transparent electrode layer 31 and the second transparent electrode layer 32.

In some embodiments, the first transparent electrode layer and the second transparent electrode layer included in the pixel electrode 20 or the common electrode 30 each includes a transparent metal oxide material, such as an ITO, an indium zinc oxide, an aluminum tin oxide, and an aluminum zinc oxide. In some embodiments, the first transparent electrode layer and the second transparent electrode layer each includes an ITO.

In some embodiments, each of the first transparent electrode layers included in the pixel electrodes 20 or the common electrodes 30 has a thickness ranged from 10 to 12 nm, and each of the second transparent electrode layers included in the pixel electrodes 20 or the common electrodes 30 has a thickness ranged from 10 to 12 nm.

In some embodiments, the material of each of the metal layers included in the pixel electrodes 20 or the common electrodes 30 is a copper or an aluminum. Each of the metal layer has a thickness ranged from 1 to 4 nanometers.

Next, the formation process of the pixel electrode 20 will be described in detail. Firstly, a substrate 10 is provided. The substrate 10 is a glass substrate in some embodiments. The substrate 10 is then cleaned for removing dust, grease, contaminants and natural oxides on the surface of the substrate 10. Afterwards, the cleaned substrate 10 undergoes a physical vapor deposition (PVD) coating operation to form a first transparent electrode layer 21, a metal layer 22, and a second transparent electrode layer 23.

In some embodiments, the substrate 10 may undergo an ITO sputtering to ionize the sputtering gas to form a plasma by the dissociation effect of high energy electrons, and the gas plasma is accelerated to bombard the target under the electric field, so that the atoms of the target are sputtered on the surface of the substrate 10 to form the first transparent electrode layer 21, and the thickness thereof is controlled to be 10 to 12 nm. In some embodiments, the substrate 10 may also be sputtered with a transparent metal oxide, such as an indium zinc oxide, aluminum tin oxide, aluminum zinc oxide, or the like to form the first transparent electrode layer 21 having a thickness ranged from 10 to 12 nm.

Next, the metal layer 22 having a thickness ranged from 1 to 4 nm is sputtered on the first transparent electrode layer 21, wherein the metal layer 22 may be a copper or an aluminum. Since the impedance of the metal, such as a copper or an aluminum, is less than the impedance of the transparent metal oxide, such as an ITO, the impedance of the pixel electrode 20 is reduced.

Finally, a transparent metal oxide, such as an ITO, an indium zinc oxide, an aluminum tin oxide, an aluminum zinc oxide or the like is sputtered on the metal layer 22 to form a second transparent electrode layer having a thickness ranged from 10 to 12 nm.

In some embodiments, the coating processes of the first transparent electrode layer 21, the metal layer 22, and the second transparent electrode layer may be accomplished by the different coating chambers in one machine without the need for an additional machine and an additional process.

Since the method for forming the common electrode 30 is similar to that of the pixel electrode 20, the present embodiment will not be described redundantly. After the pixel electrode 20 and the common electrode 30 are formed, the pixel electrode pattern and the common electrode pattern are formed by applying a photoresist, exposing, inspecting the development, measuring the size, wet etching, and peeling the photoresist.

In general, strong acid liquid is used for the wet etching to realize the patterns. When the transparent metal oxide is being etched, the etching duration of the liquid affects the line width and the etching residual of the patterns, and the line width and the etching residual are the most important performance parameters for the wet etching of the pixel electrodes. Therefore, it is necessary to precisely control the etching duration. Moreover, the liquid temperature influences the chemical reaction and the reaction rate, and influences the etching rate and the homogeneity. In addition, the change of the liquid temperature also influences the wettability between the photoresist and the film, and greatly influences the etching patterns. Hence, the liquid temperature should be strictly controlled during etching. In some embodiments, if the first transparent electrode layer and the second transparent electrode layer are both ITO materials, the oxalic acid at a temperature from 45 to 60° C. may be used for etching for 110 to 130 seconds to form the pixel electrode patterns and the common electrode patterns.

When the pixel electrodes 20 are being etched, if the etching extent is insufficient, etching residue is easily generated, resulting in dot defects and short circuits. If the etching extent is excessive, dislocation with the contact hole, point defects, and poor control of the liquid crystal molecules outside the light shielding region may be caused, resulting in light leakage. In order to prevent the excessive or insufficient etching extent, some auxiliary wires can be used.

The photoresist is peeled off by the chemical reaction of the stripping liquid and the photoresist, so that the photoresist is swollen, softened, and dissolved.

In some embodiments, the pixel electrodes and the common electrodes are formed in the same mask process, thereby effectively reducing the difficulty of the process and reducing the cost.

Figure 2:
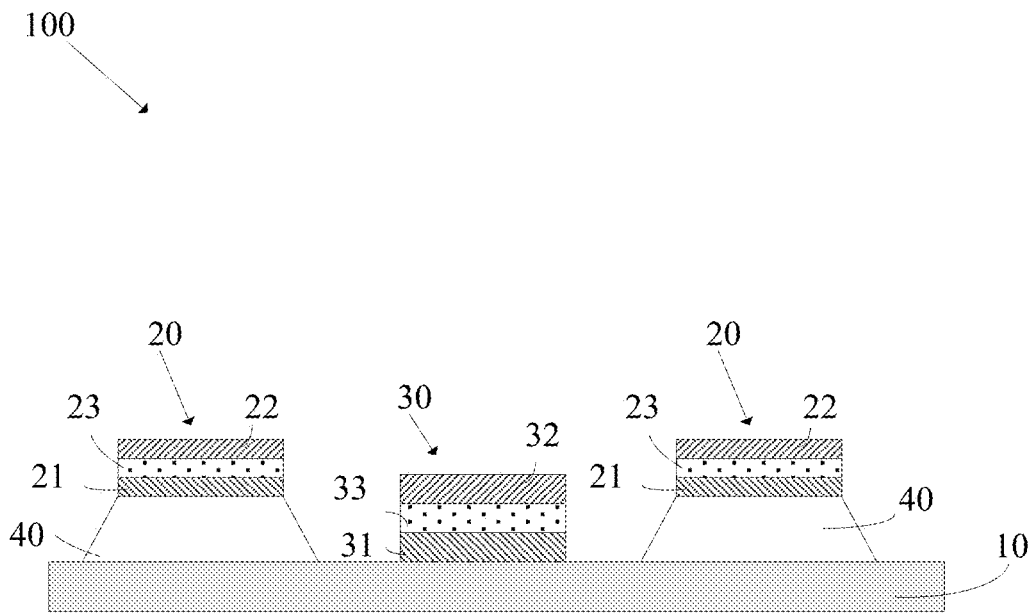
FIG. 2 is a schematic diagram of another IPS array substrate provided in an embodiment of the present disclosure.

Refer to FIG. 2, which is a schematic diagram of another IPS array substrate provided in an embodiment of the present disclosure. The IPS array substrate 100 further includes a plurality of passivation layers 40. In some embodiments, the passivation layers 40 are trapezoidal.

The passivation layers 40 are disposed between the substrate 10 and the pixel electrodes 20, and the grooves are formed between the adjacent passivation layers 40, and the common electrodes 30 are disposed within the grooves.

In the IPS array substrate and the liquid crystal display panel of the present disclosure, the impedance is reduced by a structure in which the pixel electrodes and the common electrodes are configured to have two transparent electrode layers sandwiching a metal layer.

A liquid crystal display panel is provided in the present disclosure, which includes an IPS array substrate, a liquid crystal layer and a color film substrate. The liquid crystal layer is disposed between the IPS array substrate and a color film substrate. The IPS array substrate includes a substrate, a common line, a data line, a plurality of pixel electrodes, and a plurality of common electrodes.

The common line is disposed on the substrate.

The data line is disposed on the substrate.

The pixel electrodes are disposed on the substrate and electrically connected with the data line.

The common electrodes and the pixel electrodes are alternately arranged on the substrate, the common electrodes are electrically connected with the common line, and the common electrodes and the pixel electrodes are configured to generate a horizontally oriented electric field.

Each of the common electrodes and the pixel electrodes includes a first transparent electrode layer, a second transparent electrode layer, and a metal layer between the first transparent electrode layer and the second transparent electrode layer.

Preferably, each of the first transparent electrode layers and the second transparent electrode layers includes an indium tin oxide.

Preferably, a thickness of each of the first transparent electrode layers is ranged from 10 to 12 nanometers.

Preferably, a thickness of each of the second transparent electrode layers is ranged from 10 to 12 nanometers.

Preferably, a material of each of the metal layers is a copper or an aluminum.

Preferably, a thickness of each of the metal layer is ranged from 1 to 4 nanometers.

Preferably, the pixel electrodes and the common electrodes undergo an oxalic acid etching at a temperature from 45 to 60° C. for 110 to 130 seconds to respectively form a pixel electrode patterns and a common electrode pattern.

Preferably, the pixel electrodes and the common electrodes are formed in a same masking process.

The operation principle of the liquid crystal display panel of the present preferred embodiment is the same as that of the IPS array substrate of the aforementioned preferred embodiment, is specifically described in that of the IPS array substrate of the aforementioned preferred embodiment, and is not described redundantly herein.

In the liquid crystal display panel of the present disclosure, the impedance is reduced by a structure in which the pixel electrodes and the common electrodes are configured to have two transparent electrode layers sandwiching a metal layer.

In summary, although the preferable embodiments of the present disclosure have been disclosed above, the embodiments are not intended to limit the present disclosure. A person of ordinary skill in the art, without departing from the spirit and scope of the present disclosure, can make various modifications and variations. Therefore, the scope of the disclosure is defined in the claims.

What is claimed is:

1. An IPS array substrate, comprising: a substrate, a common line, a data line, a plurality of pixel electrodes, a plurality of common electrodes, and a plurality of passivation layers;
   wherein the common line is disposed on the substrate;
   the data line is disposed on the substrate;
   the pixel electrodes are disposed on the substrate and electrically connected with the data line;
   the common electrodes and the pixel electrodes are alternately arranged on the substrate, the common electrodes are electrically connected with the common line, and the common electrodes and the pixel electrodes are configured to generate a horizontally oriented electric field; and
   each of the pixel electrodes and the common electrodes comprises a first transparent electrode layer, a second transparent electrode layer, and a metal layer between the first transparent electrode layer and the second transparent electrode layer;
   wherein the passivation layers are disposed between the substrate and the pixel electrodes, and grooves are formed between the adjacent passivation layers, the common electrodes are only disposed on bottom of the grooves, and the common electrodes are not disposed on any part of the passivation layers; and
   wherein each of the first transparent electrode layers and the second transparent electrode layers comprises an indium tin oxide.

2. The IPS array substrate as claimed in claim 1, wherein a thickness of each of the first transparent electrode layers is ranged from 10 to 12 nanometers.

3. The IPS array substrate as claimed in claim 1, wherein a thickness of each of the second transparent electrode layers is ranged from 10 to 12 nanometers.

4. The IPS array substrate as claimed in claim 1, wherein material of each of the metal layers includes copper or aluminum.

5. The IPS array substrate as claimed in claim 1, wherein a thickness of each of the metal layers is ranged from 1 to 4 nanometers.

6. The IPS type array substrate as claimed in claim 1, wherein the pixel electrodes have a pixel electrode pattern, and the common electrodes have a common electrode pattern.

7. The IPS array substrate as claimed in claim 1, wherein the pixel electrodes and the common electrodes are formed in a same masking process.

8. An IPS array substrate, comprising: a substrate, a common line, a data line, a plurality of pixel electrodes, a plurality of common electrodes, and a plurality of passivation layers;
   wherein the common line is disposed on the substrate;
   the data line is disposed on the substrate;
   the pixel electrodes are disposed on the substrate and electrically connected with the data line;
   the common electrodes and the pixel electrodes are alternately arranged on the substrate the common electrodes are electrically connected with the common line, and the common electrodes and the pixel electrodes are configured to generate a horizontally oriented electric field;
   wherein the passivation layers are disposed between the substrate and the pixel electrodes, and grooves are formed between the adjacent passivation layers, the common electrodes are only disposed on bottoms of the grooves, and the common electrodes are not disposed on any part of the passivation layers; and
   each of the pixel electrodes and the common electrodes comprises a first transparent electrode layer, a second transparent electrode layer, and a metal layer between the first transparent electrode layer and the second transparent electrode layer.

9. The IPS array substrate as claimed in claim 8, wherein each of the first transparent electrode layers and the second transparent electrode layers comprises an indium tin oxide.

10. The IPS array substrate as claimed in claim 9, wherein a thickness of each of the first transparent electrode layers is ranged from 10 to 12 nanometers.

11. The IPS array substrate as claimed in claim 9, wherein a thickness of each of the second transparent electrode layers is ranged from 10 to 12 nanometers.

12. The IPS array substrate as claimed in claim 8, wherein material of each of the metal layers includes copper or aluminum.

13. The IPS array substrate as claimed in claim 8, wherein a thickness of each of the metal layer is ranged from 1 to 4 nanometers.

14. The IPS type array substrate as claimed in claim 8, wherein the pixel electrodes have a pixel electrode pattern, and the common electrodes have a common electrode pattern.

15. The IPS array substrate as claimed in claim 8, wherein the pixel electrodes and the common electrodes are formed in a same masking process.

16. A liquid crystal display panel, comprising an IPS array substrate, which comprises a substrate, a common line, a data line, a plurality of pixel electrodes, a plurality of common electrodes, and a plurality of passivation layers;
   wherein the common line is disposed on the substrate;
   the data line is disposed on the substrate;
   the pixel electrodes are disposed on the substrate and electrically connected with the data line;
   the pixel electrodes and the common electrodes are alternately arranged on the substrate, the common electrodes are electrically connected with the common line, and the common electrodes and the pixel electrodes are configured to generate a horizontally oriented electric field;
   wherein the passivation layers are disposed between the substrate and the pixel electrodes, and grooves are formed between the adjacent passivation layers, the common electrodes are only disposed on bottoms of the grooves, and the common electrodes are not disposed on any part of the passivation layers; and
   each of the common electrodes and the pixel electrodes comprises a first transparent electrode layer, a second transparent electrode layer, and a metal layer between the first transparent electrode layer and the second transparent electrode layer.

17. The IPS array substrate as claimed in claim 16, wherein each of the first transparent electrode layers and the second transparent electrode layers comprises an indium tin oxide.

18. The IPS array substrate as claimed in claim 17, wherein a thickness of each of the first transparent electrode layers is ranged from 10 to 12 nanometers.

* * * * *